(12) United States Patent
Su et al.

(10) Patent No.: US 6,366,628 B1
(45) Date of Patent: Apr. 2, 2002

(54) METHOD AND CIRCUIT FOR SAMPLING TIMING RECOVERY

(75) Inventors: Chau-Chin Su; Lee-Yuang Huang; Jin-Jyh Lee; Chorng-Kuang Wang, all of Taoyuan Hsien (TW)

(73) Assignee: National Science Council (TW)

( * ) Notice: Subject to any disclaimer, the term of this patent is extended or adjusted under 35 U.S.C. 154(b) by 0 days.

(21) Appl. No.: 09/177,223

(22) Filed: Oct. 22, 1998

(51) Int. Cl.[7] .................................................. H04L 7/00
(52) U.S. Cl. ....................................... 375/355; 375/373
(58) Field of Search ................................... 375/376, 355, 375/373; 327/147, 156; 331/11

(56) References Cited

U.S. PATENT DOCUMENTS

| | | | | |
|---|---|---|---|---|
| 4,015,083 A | * | 3/1977 | Bellisio | 375/376 |
| 4,847,876 A | * | 7/1989 | Baumbach et al. | 375/376 |
| 5,446,416 A | * | 8/1995 | Lin et al. | 331/11 |
| 6,088,414 A | * | 7/2000 | Dove et al. | 375/376 |

OTHER PUBLICATIONS

"ATSC Digital Television Standards", *Advanced Television System Committee*, pp. 46–64, Sep. 1995.
"Guide to the Use of ATSC Digital Television Standards", *Advanced Television System Committee*, pp. 102–119, Oct. 1995.
G. Sgrignoli, W. Bretl, R. Citta, "VSB Modulation Used for Terrestrial and Cable Broadcasts", *IEEE Trans. on Consumer Electronics*, vol. 41, No. 3, pp. 367–382, Aug. 1995.
W. Bretl, P. Snopko, "VSB Modem Subsystem Design for Grand Alliance Digital Television Receivers", *IEEE Trans. on Consumer Electronics*, vol. 41, No. 3, pp. 312–313, Aug. 1995.
H. Lim, D. Lee, K. Cheun, K. Choi, M. Jung, S. Choi, "Low–Complexity Receiver Algorithms for the Grand–Alliance VSB HDTV System", *IEEE Tran. on Consumer Electronics*, vol. 42, No. 3, pp. 640–650, Aug. 1996.
K. Kim, H. Shin, D. Song, "A Symbol Timing Recovery Using the Segment Sync Data for the Digital HDTV GA VSB System", *IEEE Tran. on Consumer Electronics*, vol. 42, No. 3, pp. 651–656, Aug. 1996.
King, Jr., "Synchronization", Chapter 8 from *Digital Communications Fundamentals and Applications*, Prentice Hall International Editions, pp. 429–472, 1998.
R. E. Best, "The Linear PLL (LPLL)," Chapter 2 from *Phase–Locked Loops—Theory, Design and Applications*, McGraw–Hill International Edition, pp. 7–25, 1993.

* cited by examiner

Primary Examiner—Temesghen Ghebretinsae
(74) Attorney, Agent, or Firm—Greer, Burns & Crain, Ltd.

(57) ABSTRACT

A sampling timing recovering circuit free from being troubled by a frequency error is provided. Such recovering circuit includes a phase locking circuit having a local frequency for processing an incoming signal having a phase, a specific parameter and an input symbol rate and for locking the phase of the incoming signal, and a frequency locking circuit electrically connected to the phase locking circuit for locking the input symbol rate of the incoming signal to enable the phase locking circuit to desiredly process the incoming signal. A method to this effect is also provided and includes the steps of a) processing an incoming signal having a phase, a specific parameter and an input symbol rate to have the phase lockable, b) locking the phase of the incoming signal, and c) locking the input symbol rate of the incoming signal to enable the incoming signal to be predeterminedly processed.

16 Claims, 6 Drawing Sheets

METHOD AND CIRCUIT FOR SAMPLING TIMING RECOVERY

FIELD OF THE INVENTION

The present invention relates to a sampling timing recovering method, and to a sampling timing recovering circuit.

BACKGROUND OF THE INVENTION

Digital communication systems generally rely on a synchronization word to separate a data frame or segment and to decode the data. In addition, the synchronization word in the data frame or segment is also relied on for sampling timing recovery normally completed by a step of detecting the synchronization word and a step of recovering the sampling timing.

As shown in FIG. 1, in a sampling timing recovery circuit structure, the synchronization word is detected by a correlator 11 comparing the difference between the stored synchronization word and the sampled portion of the incoming signal. The segment integrator 12 integrates to determine the similarity of every sampled data segment to the stored synchronization, and is a serial shift register having a length equal to that of the data segment. The synchronization word detector 13 locates a sampled data segment having a maximum value as the synchronization word to be found. The confidence counter 14 counts how many synchronization words have been detected. The phase detector 15 is used to detect the phase error of the sampled data segment. This phase error is processed by the Automatic Phase Control Low Pass Filter (APC LPF) 16 to adjust the voltage controlled crystal oscillator (VCXO) 17 for the purpose of phase locking.

FIG. 2 shows another sampling timing recovering circuit structure which differs from FIG. 1 in that a hard limiter 21 is provided before the correlator 11 for reducing the complexity of the circuit, which, nevertheless, is useful only for the particular synchronization word. Certainly, under such structure, the segment integrator 12 might be optional for a different circuit design according to the prior art.

In such prior sampling timing recovering circuits, all of them suffer from a common problem resulting from a symbol frequency error between the local sampling frequency of the analog-to-digital convertor and the input symbol rate (frequency) of the incoming signal. If the symbol frequency error is too large, it would be quite possible that the synchronization word is no longer detectible and the sampling timing is no longer recoverable in that there will be a too fast phase drift so that the segment integrator cannot so accumulate as to enable the confidence counter to finish counting. As an example, if there is a data frame having 1,000 symbols and if the frequency error is 100 ppm (parts per million), every entire frame will drift 0.1 symbol time (Ts). Specifically, if the phase detector can only detect the phase error in the range of +/−45 degrees, the phase detector can only detect two consecutive synchronization words, which are assumed to have a phase difference of 72 degrees in the above-mentioned example, so that the confidence counter, which normally counts more than 3, cannot finish its counting. Generally, the situation is more serious and worse. Even if the confidence counter can finish its counting, the phase might have drifted to the brim of the phase detecting range and continuously drifts. As a result, the phase has drifted out of the phase detecting range before the sampling timing recovering circuit can respond so that the operations of the synchronization word detection and the timing recovery must be performed again.

It is therefore attempted by the applicant to deal with the above situation encountered by the prior art.

SUMMARY OF THE INVENTION

It is therefore an object of the present invention to provide a method or a circuitry capable of facilitating the operation of the sampling timing recovering circuit.

It is further an object of the present invention to provide a sampling timing recovering method or circuit free from malfunction due to the frequency error.

It is still an object of the present invention to provide a sampling timing recovering method or circuit having a reduced frequency and a reduced phase error.

It is additionally an object of the present invention to provide a sampling timing recovering circuit or method with a better stability and a smaller phase jitter.

According to a first aspect of the present invention, a sampling timing recovering circuit includes a phase locking circuit having a local sampling frequency for processing an incoming signal having a phase, a specific parameter and an input symbol rate, and for locking the phase of said incoming signal, and a frequency locking circuit electrically connected to the phase locking circuit for locking the input symbol rate of the incoming signal to enable the phase locking circuit to process the incoming signal.

Preferably the present circuit further includes a synchronization word detecting circuit electrically connected to the phase locking circuit for detecting the specific parameter being a synchronization word, and a confidence counter circuit electrically connected to the synchronization word detecting circuit for identifying a location of the synchronization word and a frame number that the incoming signal requires to experience in the confidence counter circuit an entire cycle.

Certainly, the synchronization word can be assumed to be detected when a Boolean distance between a predetermined synchronization word and a sampled section of the incoming signal is found to be smaller than a predetermined value.

Certainly, the confidence counter circuit can be a dual loop confidence counter circuit which includes a detecting confirming circuit electrically connected to the synchronization word detecting circuit for confirming the synchronization word is detected, and a loss confirming circuit electrically connected to the detecting confirming circuit and initiated thereby when the synchronization word is confirmed to be detected by the detecting confirming circuit for initiating the detecting confirming circuit after the synchronization word is confirmed to be lost.

Certainly, we can assume that the synchronization word is confirmed to be detected when synchronization words in a specific number of consecutive data segments are all detected. By the same token, the synchronization word is confirmed to be lost when none of synchronization words in a specific number of consecutive data segments is detected.

Certainly, the frequency locking circuit can include a frequency error detecting circuit electrically connected to the confidence counter circuit and the phase locking circuit for generating, in response to the frame number, an initiating signal to be outputted to the phase locking circuit and a frequency error between the input symbol rate and the local sampling frequency, and a frequency compensating circuit electrically connected to the frequency error detecting circuit and the phase locking circuit for generating a frequency compensating voltage to be outputted to the phase locking circuit in response to the frequency error.

Certainly, the phase locking circuit can include an analog-to-digital converter electrically connected to the synchronization word detecting circuit for sampling and quantifying the incoming signal to be outputted to the synchronization word detecting circuit, a phase detecting circuit electrically connected to the analog-to-digital converter and the frequency error detecting circuit for detecting a phase error of the incoming signal to generate a phase compensating voltage in response to the initiating signal, and a voltage controlled oscillator electrically connected to the analog-to-digital converter, the phase detecting circuit and the frequency compensating circuit for generating, in response to the frequency compensating voltage and the phase compensating voltage, a clock having a specific phase and a specific frequency the same to those of the incoming signal to be outputted to the analog-to-digital converter for modifying the phase of the incoming signal and the local sampling frequency of the phase locking circuit.

In a practical instance, the frequency error can be a Doppler effect.

In an embodiment, the phase locking circuit processes the incoming signal into a digital signal.

In an example, the incoming signal has a data segment format and a segment synchronization word.

In a first application, the incoming signal can be used in a Advanced Television Systems Committee system.

In a second application, the incoming signal can be used in an Asymmetric Digital Subscriber Loop system.

In a third application, the incoming signal can be used in a European Digital Audio Broadcasting system.

In accordance with a second aspect of the present invention, a sampling timing recovering method includes the steps of a) processing an incoming signal having a phase, a specific parameter and an input symbol rate to have the phase lockable, (b) locking the input symbol rate of the incoming signal, and (c) locking the phase of the incoming signal to enable the incoming signal to be predeterminedly processed.

Preferably the present method further includes d) detecting the specific parameter being a synchronization word, and e) identifying a location of the synchronization word and a frame number that the incoming signal has been ascertainable.

Preferably the present method further includes f) generating, in response to the frame number, a frequency error between the input symbol rate and a local frequency, and g) generating a frequency compensating voltage in response to the frequency error.

Preferably the present method further includes i) detecting a phase error of the incoming signal to generate a phase compensating voltage, and generating, in response to the frequency compensating voltage and the phase compensating voltage, a clock having a specific phase and a specific frequency the same to those of the incoming signal for modifying the phase of the incoming signal and the local frequency.

The present invention may best be understood through the following descriptions with reference to the accompanying drawings, in which:

DETAILED DESCRIPTION OF THE PREFERRED EMBODIMENTS

Figure 1:
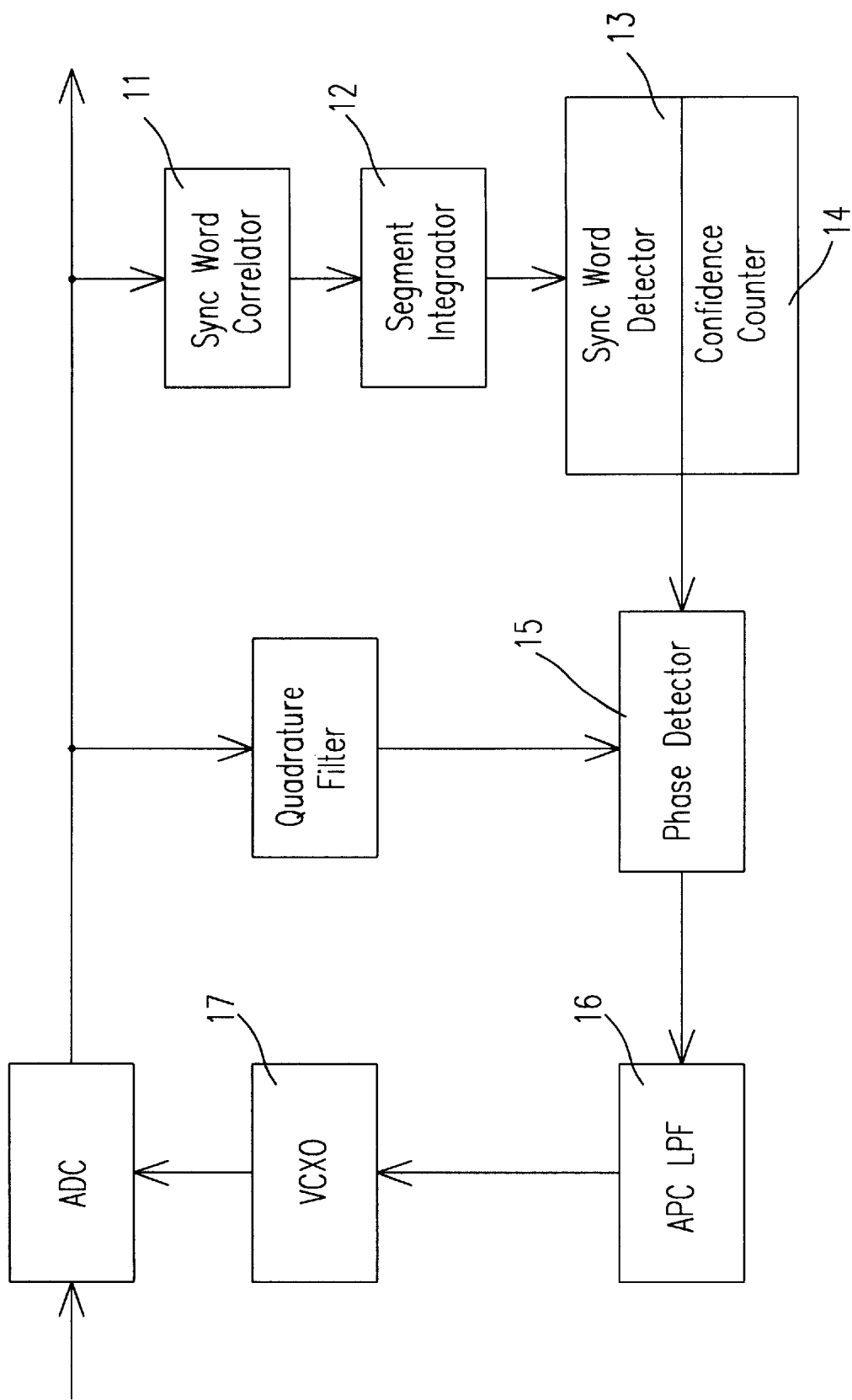
FIG. 1 is a first sampling timing circuit structure according to the prior art.
Figure 2:
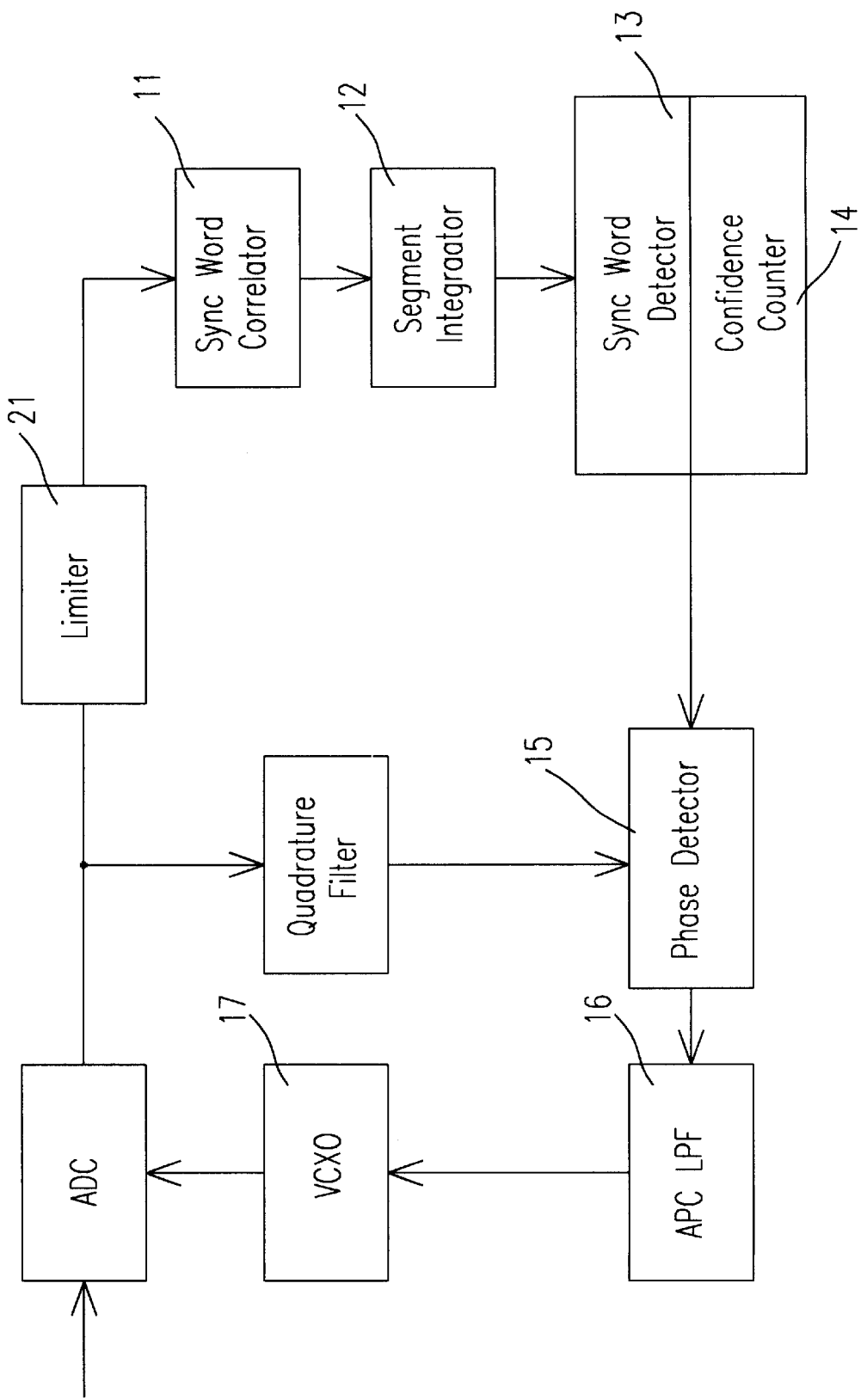
FIG. 2 is a second sampling timing circuit structure according to the prior art.
Figure 3:
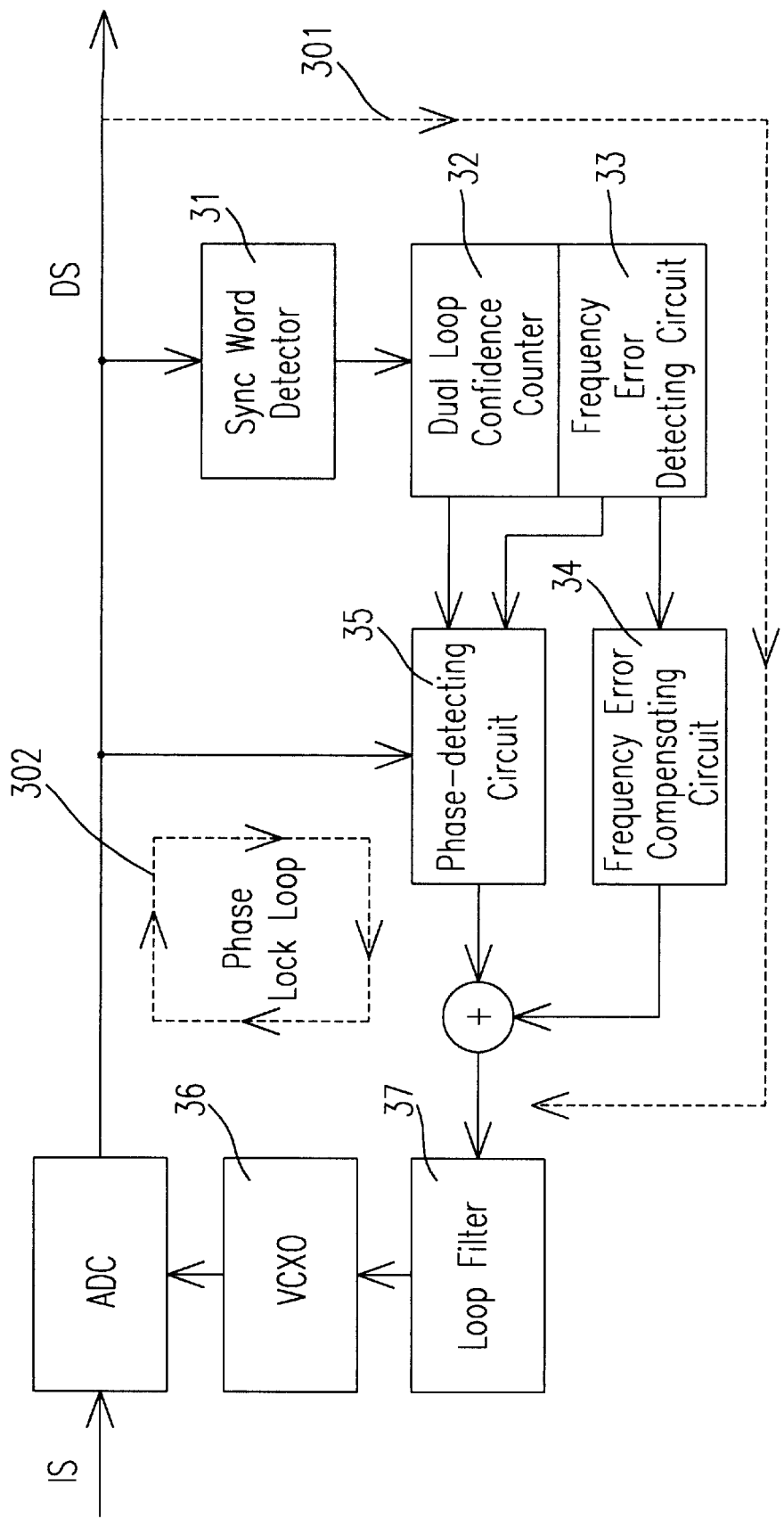
FIG. 3 is a sampling timing circuit of a preferred embodiment according to the present invention.

The present invention is proposed to increase the performance of using the data segment synchronization word to recover the sampling timing by means of the detecting and compensating techniques of the sampling frequency error which can be easily obtained through lost and/or added symbols. When the sampling frequency is compensated to the vicinity of the input symbol frequency (or rate), the relevant sampling timing recovery circuit will have enough time to detect and compensate the phase error so that the sampling timing recovery circuit with a better stability and a smaller phase jitter is made possible. Referring now to FIG. 3, there is shown a preferred embodiment of a sampling timing recovery circuit according to the present invention which includes an outer frequency compensating loop 301 for compensating a large frequency error and an inner phase locking loop 302 for fine tuning the phase. Generally speaking, the present sampling timing recovery circuit includes a phase locking circuit (positioned around phase locking loop 302) having a local sampling frequency for processing an incoming signal IS having a phase, a specific parameter (being a synchronization word in this embodiment) and an input symbol rate (or frequency), and for locking the phase of incoming signal IS, and a frequency locking circuit (positioned around frequency compensating loop 301) electrically connected to the phase locking circuit for locking the input symbol rate of incoming signal IS to enable the phase locking circuit to process incoming signal IS as desired.

The synchronization word is to be detected by the synchronization word detector 31 electrically connected to the phase locking circuit and to be identified its location by a confidence counter circuit 32 electrically connected to synchronization word detector 31. Confidence counter circuit 32 also identifies a frame number that incoming signal IS requires to experience therein a full cycle.

The frequency locking circuit includes a frequency error detecting circuit 33 electrically connected to confidence counter circuit 32 and the phase locking circuit for generating, in response to the frame number, an initiating signal to be outputted to the phase locking circuit and a frequency error between the input symbol rate and the local sampling frequency of the phase locking circuit, and a frequency compensating circuit 34 electrically connected to frequency error detecting circuit 33 and the phase locking circuit for generating a frequency compensating voltage to be outputted to the phase locking circuit in response to the frequency error.

Synchronization word detector 31 can be a correlator or a matched filter. The synchronization word can be assumed to be detected when a Boolean distance between a predetermined synchronization word and a sampled section of incoming signal IS is found to be smaller than a predetermined value. The prerequisite that the synchronization word can be correctly recognized is that the sampling phase must reside in the scan range of synchronization word detector 31. Thus, the phase drift resulting from the sampling frequency error will determine the recognizable number of consecutive synchronization words.

The phase locking circuit includes an analog-to-digital converter (ADC) electrically connected to synchronization word detecting circuit 31 for sampling and quantifying incoming signal IS to be outputted to synchronization word detecting circuit 31, a phase detecting circuit 35 electrically connected to the analog-to-digital converter and frequency error detecting circuit 33 for detecting a phase error of incoming signal IS to generate a phase compensating voltage in response to the initiating signal, and a voltage controlled crystal oscillator (VCXO) 36 electrically connected to the analog-to-digital converter, phase detecting circuit 35 and frequency error compensating circuit 34 for generating, in response to the frequency compensating voltage from frequency error compensating circuit 34 and the phase compensating voltage from phase detecting circuit 35, a clock having a specific phase and a specific frequency the same to those of incoming signal IS to be outputted to the analog-to-digital converter (ADC) for modifying the phase of incoming signal IS and the local sampling frequency of the phase locking circuit.

Figure 4:
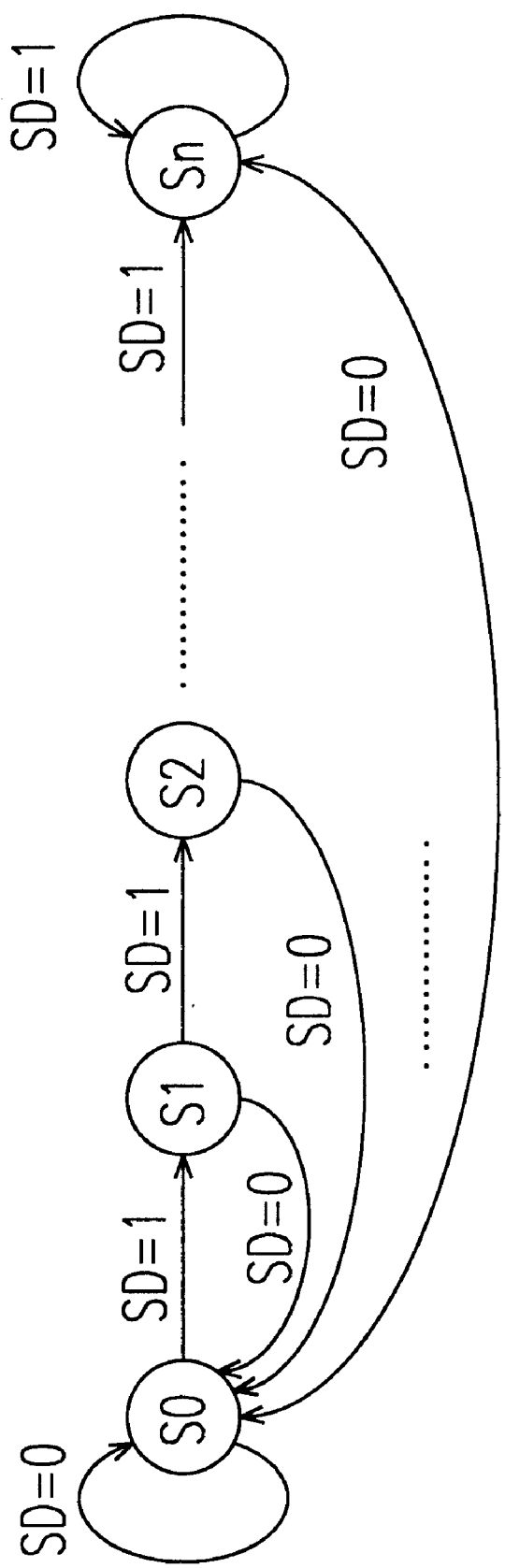
FIG. 4 is a schematical view showing a general state diagram of a confidence counter.

When the first synchronization word is detected, confidence counter 32 will be actuated. Confidence counter 32 is a state machine and will calculate how many consecutive synchronization words have been detected for confirming the location of the synchronization word. Confidence counter 32 normally has a state diagram as shown in FIG. 4. Accordingly, the prerequisite that the synchronization word can be confirmed its location is that the state number of confidence counter 32 is fewer than or equal to the number of the detectable consecutive synchronization words. This situation is rectified by a sampling timing recovering circuit according to the present invention.

Figure 5:
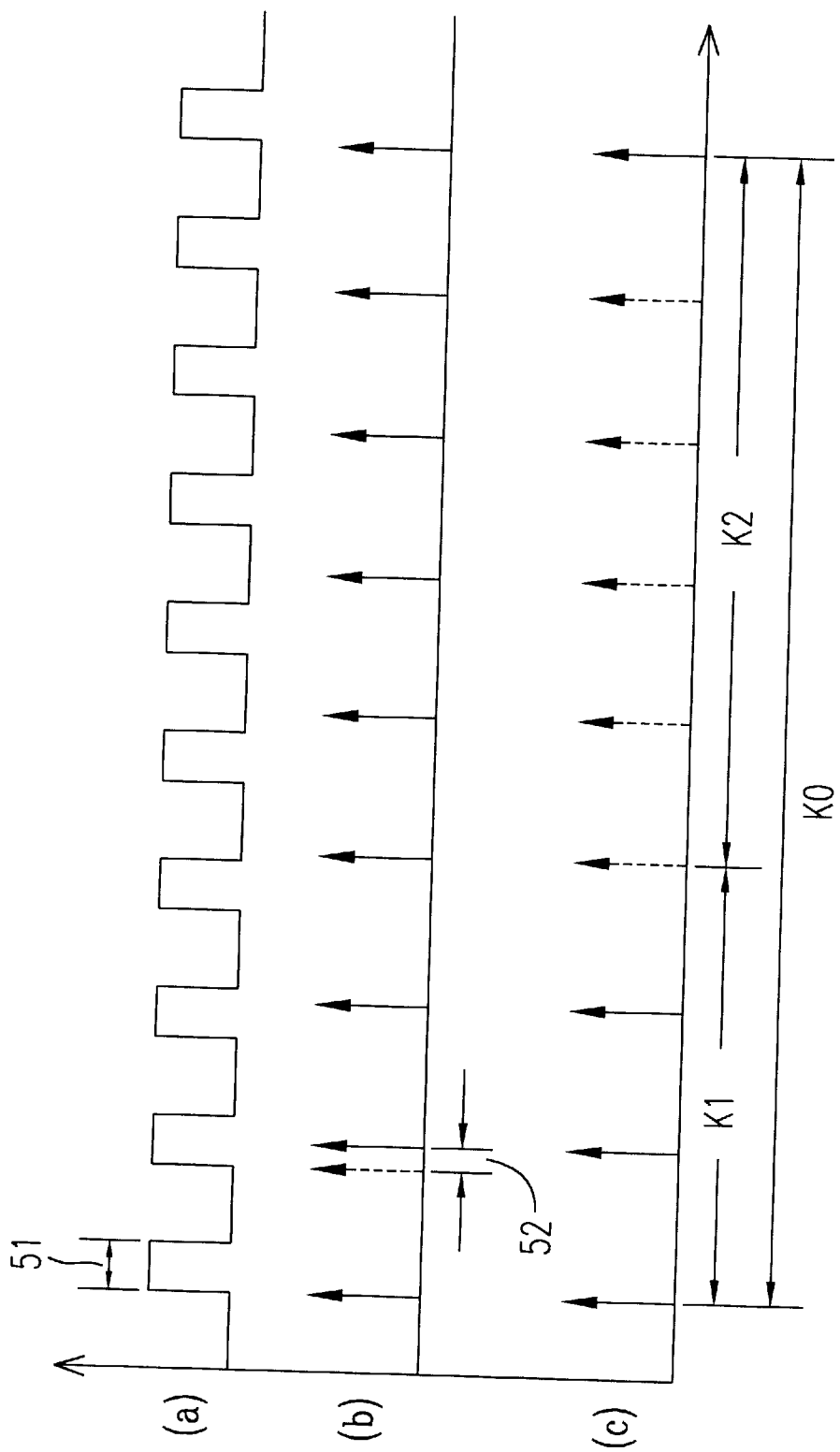
FIG. 5 is a pulse diagram showing a synchronization word detection-loss cycle for a sampling timing recovering circuit according to a preferred embodiment of the present invention.

The frequency error is calculated by using the period of the detection-loss cycle of the synchronization word. Whenever there is a frequency error, the sampling phase will repetitively drift into and out of the scan range of the synchronization word detecting circuit as shown in FIG. 5. If the scan range 51 of the synchronization word detecting circuit is $\phi_{srange}$ as shown by pulse (a) and if the phase drift angle 52 of every sampled data segment is $\Delta\theta_{1s}$ as shown by pulse (b), the synchronization words detected by the synchronization word detecting circuit will be a series of pulses as shown by pulse (c). In this detection-loss cycle, there are $K_0$ data frames including $K_1$ frames the synchronization words of which are consecutively detectible and $K_2$ frames the synchronization words of which are not detectible. In every detection-loss-regaining cycle, there will be one missing or extra symbols. Thus, the frequency error can be obtained from the following equation:

$$\Delta f_s/f_s = 1/(K_0 \times N_{1s})$$

where $K_0$ is the total number of data segments or frames in the detection-loss-regaining cycle and $N_{1s}$ is the number of symbols in a data segment or frame.

Figure 6:
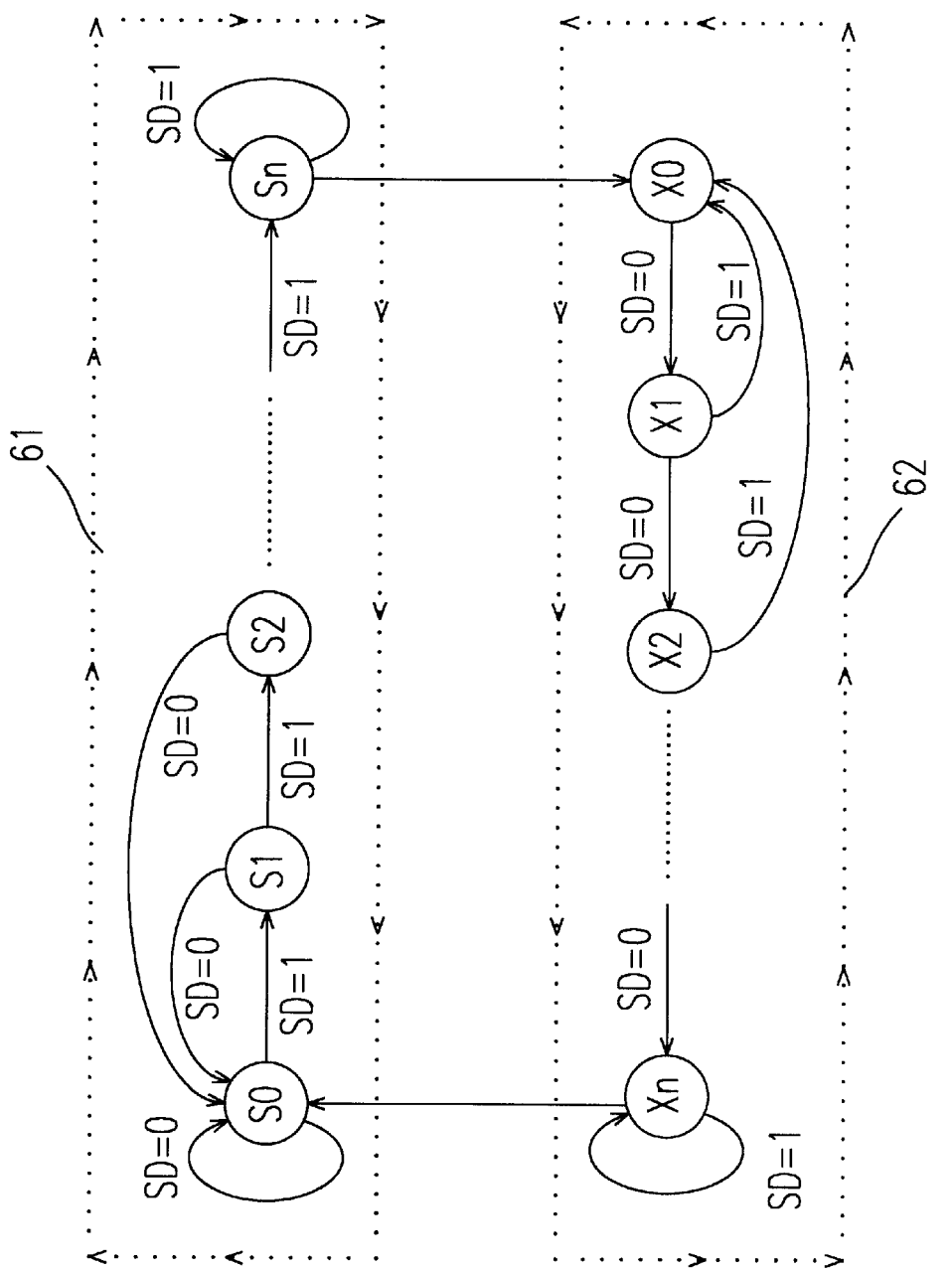
FIG. 6 is a state diagram showing a dual loop confidence counter of a sampling timing recovering circuit according to the present invention.

The length of the detection-loss cycle can be determined by the present confidence counter 32 being a dual loop confidence counter circuit, as shown in FIG. 6, which includes a detecting confirming circuit 61 electrically connected to synchronization word detecting circuit 31 for confirming the synchronization word is detected by states S0, S1,...Sn, and a loss confirming circuit 62 electrically connected to detecting confirming circuit 61 and initiated thereby when the synchronization word is confirmed to be detected by detecting confirming circuit 61 for initiating detecting confirming circuit 61 after the synchronization word is confirmed to be lost by states X1, X2, ... Xm. The synchronization word is confirmed to be detected when synchronization words in a specific number of consecutive data segments are all detected, and is confirmed to be lost when none of synchronization words in a specific number of consecutive data segments is detected. The period $K_0$ of the detection-loss cycle is the total frame number within which the synchronization word is confirmed to be detected, confirmed to be lost and then confirmed to be re-obtained, or the required frame number that the state Sn-1 is changed into the state Sn for the second time. After $K_0$ is known, the frequency error is readily obtainable from the above equation.

Thus, while confidence counter 32 is confirming the synchronization word is detected, frequency error detecting circuit 33 will calculate the frequency error by which frequency error compensating circuit 34 will generate the relatively large frequency compensating voltage or a direct bias voltage to which voltage controlled crystal oscillator 36 responds in order to oscillate at the vicinity of the input symbol rate. After the sampling frequency is compensated, phase detecting circuit 35 will detect a phase error by which the loop filter 37 electrically connected to phase detecting circuit 35 will generate the phase compensating voltage which will finely tune voltage controlled crystal oscillator 36 to compensate the phase of the sampling clock generated thereby.

The frequency compensating voltage ($V_{comp}$) can be calculated as follows:

$$V_{comp} = \Delta f / K_{vco}$$

Where Kvco is the gain of voltage controlled crystal oscillator 36. After the frequency error has been compensated, VCXO 36 will oscillate at the vicinity of the input symbol rate to be further finely tuned and locked in respect of the phase by the phase locking circuit. Since the frequency compensation is separately operated with respect to the phase compensation, the frequency error will no more adversely affect the phase compensation.

If the frequency error is smaller than the capture range $\Delta f_{PLL}$ of the phase locking circuit, which is defined as a small frequency error detection, there is no necessity to compensate the frequency error. The following equation defines the number of synchronization words that can be detected in the scan range of the synchronization word detecting circuit if the frequency error is less than $\Delta f_{PLL}$:

$$K1 \geq (\phi_{srange}/2\pi) \times (f_s/\Delta f_{PLL}) \times (1/N_{1s})$$

If the number of detected consecutive synchronization words is more than K1 obtained through the above equation, the frequency error compensating circuit is shut down and the phase locking circuit is initiated. The advantage of using a small frequency error detection is to shorten the time for frequency error detection.

It can be thus known that a sampling timing recovery circuit according to the present invention has a broadened frequency capture range and a smaller stability variation, can be applied to the digital communication system using the code frame as the transmission format, and positively lower the phase jitter and enhance the overall performance and preciseness of the entire communication system. Certainly, the frequency error can be a Doppler effect. The phase locking circuit can process the incoming signal IS into a digital signal DS. The incoming signal IS can have a data segment format and a segment synchronization word. Such incoming signal IS can be one used in an Advanced Television Systems Committee system, one used in an Asymmetric Digital Subscriber Loop system, or one used in a European Digital Audio Broadcasting system.

Through the above descriptions, we can realize that a sampling timing recovering method according to the present invention includes the steps of a) processing an incoming signal IS having a phase, a specific parameter and an input symbol rate to have the phase lockable, b) locking the phase of the incoming signal IS, c) locking the input symbol rate of the incoming signal IS to enable the incoming signal IS to be predeterminedly processed, d) detecting the specific parameter being a synchronization word, e) identifying a location of the synchronization word and a frame number immediately after the incoming signal has been ascertainable, f) generating, in response to the frame number, a frequency error between the input symbol rate and a local frequency, g) generating a frequency compensating voltage in response to the frequency error, i) detecting a phase error of the incoming signal IS to generate a phase compensating voltage, and j) generating, in response to the frequency compensating voltage and the phase compensating voltage, a clock having a specific phase and a specific frequency the same to those of the incoming signal IS for modifying the phase of the incoming signal IS and the local frequency.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What we claim is:

1. A sampling timing recovering circuit comprising:
   a phase locking circuit having a local sampling frequency for processing an incoming signal having a phase, a specific parameter and an input symbol rate, and for locking said phase of said incoming signal;
   a synchronization word detecting circuit electrically connected to said phase locking circuit for detecting said specific parameter being a synchronization word;
   a confidence counter circuit for identifying a location of said synchronization word and a frame number that said incoming signal requires to experience in said confidence counter circuit an entire cycle, said confidence counter circuit including a detecting confirming circuit electrically connected to said synchronization word detecting circuit for confirming said synchronization word is detected, and a loss confirming circuit electrically connected to said detecting confirming circuit and initiated thereby when said synchronization word is confirmed to be detected by said detecting confirming circuit for initiating said detecting confirming circuit after said synchronization word is confirmed to be lost; and
   a frequency locking circuit electrically connected to said phase locking circuit for locking said input symbol rate of said incoming signal to enable said phase locking circuit to process said incoming signal.

2. A circuit according to claim 1, wherein said synchronization word is assumed to be detected when a Boolean distance between a predetermined synchronization word and a sampled section of said incoming signal is found to be smaller than a predetermined value.

3. A circuit according to claim 1, wherein said synchronization word is confirmed to be detected when synchronization words in a specific number of consecutive data segments are all detected.

4. A circuit according to claim 1, wherein said synchronization word is confirmed to be lost when none of synchronization words in a specific number of consecutive data segments are detected.

5. A circuit according to claim 1, wherein said frequency locking circuit includes:
   a frequency error detecting circuit electrically connected to said confidence counter circuit and said phase locking circuit for generating, in response to said frame number, an initiating signal to be outputted to said phase locking circuit and a frequency error between said input symbol rate and said local sampling frequency; and
   a frequency compensating circuit electrically connected to said frequency error detecting circuit and said phase locking circuit for generating a frequency compensating voltage to be outputted to said phase locking circuit in response to said frequency error.

6. A circuit according to claim 5 wherein said phase locking circuit includes:
   an analog-to-digital converter electrically connected to said synchronization word detecting circuit for sampling and quantifying said incoming signal to be outputted to said synchronization word detecting circuit;
   a phase detecting circuit electrically connected to said analog-to-digital converter and said frequency error detecting circuit for detecting a phase error of said incoming signal to generate a phase compensating voltage in response to said initiating signal; and
   a voltage controlled oscillator electrically connected to said analog-to-digital converter, said phase detecting circuit and said frequency compensating circuit for generating, in response to said frequency compensating voltage and said phase compensating voltage, a clock having a specific phase and a specific frequency the same to those of said incoming signal to be outputted to said analog-to-digital converter for modifying said phase of said incoming signal and said local sampling frequency of said phase locking circuit.

7. A circuit according to claim 5 wherein said frequency error is a Doppler effect.

8. A circuit according to claim 1 wherein said phase locking circuit processes said incoming signal into a digital signal.

9. A circuit according to claim 1 wherein said incoming signal has a data segment format and a segment synchronization word.

10. A circuit according to claim 9 wherein said incoming signal is used in a Advanced Television System Committee system.

11. A circuit according to claim 9 wherein said incoming signal is used in an Asymmetric Digital Subscribe Loop system.

12. A circuit according to claim 9 wherein said incoming signal is used in a European Digital Audio Broadcasting system.

13. A sampling timing recovering method comprising the steps of:
a) processing an incoming signal having a phase, a specific parameter and an input symbol rate;
b) locking said phase of said incoming signal;
c) locking said input symbol rate of said incoming signal to enable said incoming signal to be predeterminedly processed;
d) detecting said specific parameter being a synchronization word;
e) identifying a location of said synchronization word and a frame number when said incoming signal has been ascertainable;
f) generating, in response to said frame number, a frequency error between said input symbol rate and a local frequency; and
g) generating a frequency compensating voltage in response to said frequency error.

14. A method according to claim 13, further comprising:
i) detecting a phase error of said incoming signal to generate a phase compensating voltage; and
j) generating, in response to said frequency compensating voltage and said phase compensating voltage, a clock having a specific phase and a specific frequency the same to those of said incoming signal for modifying said phase of said incoming signal and said local frequency.

15. A sampling timing recovering circuit, comprising:
a phase locking circuit having a local sampling frequency for processing an incoming signal having a phase, a specific parameter and an input symbol rate, and for locking said phase of said incoming signal;
a synchronization word detecting circuit electrically connected to said phase locking circuit for detecting said specific parameter being a synchronization word;
a confidence counter circuit electrically connected to said synchronization word detecting circuit for identifying a location of said synchronization word and a frame number that said incoming signal requires to experience in said confidence counter circuit an entire cycle;
a frequency error detecting circuit electrically connected to said confidence counter circuit and said phase locking circuit for generating, in response to said frame number, an initiating signal to be outputted to said phase locking circuit and a frequency error between said input symbol rate and said local sampling frequency; and
a frequency compensating circuit electrically connected to said frequency error detecting circuit and said phase locking circuit for generating a frequency compensating voltage to be outputted to said phase locking circuit in response to said frequency error.

16. A circuit according to claim 15, wherein said confidence counter circuit is a dual loop confidence counter circuit which includes:
a detecting confirming circuit electrically connected to said synchronization word detecting circuit for confirming said synchronization word is detected; and
a loss confirming circuit electrically connected to said detecting confirming circuit and initiated thereby when said synchronization word is confirmed to be detected by said detecting confirming circuit for initiating said detecting confirming circuit after said synchronization word is confirmed to be lost.

* * * * *